United States Patent
Park

(10) Patent No.: US 9,196,659 B2
(45) Date of Patent: Nov. 24, 2015

(54) METHOD FOR FABRICATING AN ELECTRONIC DEVICE WITH ANTI-OXIDATION LAYERS

(71) Applicant: SK hynix Inc., Icheon-si (KR)

(72) Inventor: Hae-Chan Park, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/289,574

(22) Filed: May 28, 2014

(65) Prior Publication Data

US 2015/0132944 A1 May 14, 2015

(30) Foreign Application Priority Data

Nov. 13, 2013 (KR) .................. 10-2013-0137651

(51) Int. Cl.
*H01L 27/24* (2006.01)
*H01L 45/00* (2006.01)

(52) U.S. Cl.
CPC .......... *H01L 27/249* (2013.01); *H01L 45/1226* (2013.01); *H01L 45/145* (2013.01); *H01L 45/1658* (2013.01)

(58) Field of Classification Search
CPC ..................... H01L 27/249; H01L 45/1658
See application file for complete search history.

(56) References Cited

U.S. PATENT DOCUMENTS

2014/0061577 A1* 3/2014 Kanno et al. ............ 257/5

FOREIGN PATENT DOCUMENTS

KR 10-2008-0010621 A 1/2008

* cited by examiner

*Primary Examiner* — Daniel Luke

(57) ABSTRACT

An electronic device includes a semiconductor memory circuit. The semiconductor memory circuit includes a plurality of first conductive lines which includes an anti-oxidation layer on both sides of each first conductive line, an inter-layer dielectric layer suitable for gap-filling a space between the first conductive lines, a material layer formed over the first conductive lines and the inter-layer dielectric layer and including oxygen vacancies, and a plurality of second conductive lines formed over the material layer to intersect with the first conductive lines. A first portion of the material layer where the first conductive lines and the second conductive lines overlap each other has a lower oxygen content than a second portion of the material layer where the inter-layer dielectric layer and the second conductive lines overlap each other.

7 Claims, 14 Drawing Sheets

METHOD FOR FABRICATING AN ELECTRONIC DEVICE WITH ANTI-OXIDATION LAYERS

CROSS-REFERENCE TO RELATED APPLICATION

The present application claims priority to Korean Patent Application No. 10-2013-0137651, entitled "ELECTRONIC DEVICE AND METHOD FOR FABRICATING THE SAME" and filed on Nov. 13, 2013, which is incorporated herein by reference in its entirety.

BACKGROUND

1. Field

Embodiments of the present disclosure relate to memory circuits or devices and their applications in electronic devices or system.

2. Description of the Related Art

Recently, as electronic devices become smaller with low power consumption, high performance, and multi-functionality, semiconductor devices capable of storing information in these small electronic devices (e.g., computers, portable communication devices, and the like) are increasingly in demand. Such semiconductor devices storing data may use a resistance variable element switching between different resistance states according to a voltage or current applied to such an element. Semiconductor devices include, for example, resistive random access memory (RRAM) devices, phase-change random access memory (PRAM) devices, ferroelectric random access memory (FRAM) devices, magneto-resistive random access memory (MRAM) devices, E-fuses, and the like.

SUMMARY

Embodiments of the present disclosure relate to memory circuits, devices, and their applications in electronic devices or systems. Various embodiments are directed to an electronic device of which an integration degree may be increased and a method for fabricating the same that may be simplified while reducing production costs.

In an embodiment, an electronic device comprising a semiconductor memory unit includes: a plurality of first conductive lines which includes an anti-oxidation layer on both sides of each first conductive line; an inter-layer dielectric layer suitable for gap-filling a space between the first conductive lines; a material layer formed over the first conductive lines and the inter-layer dielectric layer and containing oxygen; and a plurality of second conductive lines formed over the material layer to intersect with the first conductive lines. Herein, the material layer of a first region where the first conductive lines and the second conductive lines overlap each other has a lower oxygen content than the material layer of a second region where the inter-layer dielectric layer and the second conductive lines overlap each other.

The material layer may overlap the second conductive lines in a lower portion of each second conductive line. The material layer may include a transition metal oxide. The anti-oxidation layer may include a nitride. The inter-layer dielectric layer may include an oxide.

The electronic device may further include a microprocessor that includes a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor that includes a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

The electronic device may further include a data storage system that includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

The electronic device may further include a memory system that includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that is part of the memory or the buffer memory in the memory system.

In an embodiment, an electronic device including a semiconductor memory unit includes: a plurality of horizontal electrodes and plurality of first inter-layer dielectric layers that are alternately stacked over a substrate; a plurality of anti-oxidation layers interposed between the horizontal electrodes and the first inter-layer dielectric layers; vertical electrodes coupled with the substrate by penetrating through the horizontal electrodes, the first inter-layer dielectric layers, and the anti-oxidation layers; and a material layer interposed between the vertical electrodes and the horizontal electrodes and containing oxygen, wherein the material layer of a first region where the horizontal electrodes and the vertical electrodes overlap each other has a lower oxygen content than the material layer of a second region where the first inter-layer dielectric layers and the vertical electrodes overlap each other.

The material layer may include a transition metal oxide. The anti-oxidation layers may include a nitride. Each of the anti-oxidation layers may include: a first anti-oxidation layer interposed between the first inter-layer dielectric layer and a lower portion of each horizontal electrode; and a second anti-oxidation layer interposed between an upper portion of each horizontal electrode and the first inter-layer dielectric layer.

The electronic device may further include: an isolation layer interposed between the vertical electrodes to penetrate through the horizontal electrodes, the first inter-layer dielectric layers, and the anti-oxidation layers; a second inter-layer dielectric layer formed over the substrate structure including the isolation layer; contacts coupled with the vertical electrodes through the second inter-layer dielectric layer; and lines formed over the second inter-layer dielectric layer to be coupled with the contacts.

In an embodiment, an electronic device including a semiconductor memory circuit, wherein the semiconductor memory circuit includes: a plurality of first conductive lines disposed over a substrate and spaced apart from each other; an anti-oxidation layer disposed on both sidewalls of each of the first conductive lines; an inter-layer dielectric layer disposed in a space between two adjacent first conductive lines including sidewalls on which the anti-oxide layer is disposed; a material layer formed over the first conductive lines and the inter-layer dielectric layer, the material layer including a first portion and a second portion; and a plurality of second conductive lines disposed over the material layer to intersect with the first conductive lines, wherein the first portion of the material layer is disposed in a first region where the first conductive line and the second conductive line overlap each other and the second portion of the material layer is disposed in a second region where the inter-layer dielectric layer and the second conductive line overlap each other, and wherein the first portion of the material layer has less oxygen contents than the second portion of the material layer.

In an embodiment, an electronic device including a semiconductor memory circuit, wherein the semiconductor memory circuit includes: a substrate; a stacked structure disposed over the substrate, the stacked structure including a horizontal electrode, a first inter-layer dielectric layer, and an anti-oxidation layer, which are vertically stacked, the anti-oxidation layer being interposed between the horizontal electrode and the first inter-layer dielectric layer; a vertical electrode coupled with the substrate by penetrating through the stacked structure; and a material layer interposed between the vertical electrode and the stacked structure, the material layer including a first portion and a second portion, wherein the first portion of the material layer is disposed in a first region where the horizontal electrode and the vertical electrode overlap each other and the second portion of the material layer is disposed in a second region where the first inter-layer dielectric layer and the vertical electrode overlap each other, and wherein the first portion of the material layer has less oxygen contents than the second portion of the material layer.

The stacked structure may be a first stacked structure and the anti-oxidation layer may be a first anti-oxidation layer, the electronic device further comprising a second stacked structure stacked over the first stacked structure, wherein the second stacked structure may include a second anti-oxidation layer disposed over the horizontal electrode of the first stacked structure; and a second inter-layer dielectric layer disposed over the second anti-oxidation layer.

The vertical electrode may be a first vertical electrode, the electronic device may further include a second vertical electrode coupled with the substrate by penetrating through the stacked structure, the second vertical electrode being spaced apart from the first vertical electrode; an isolation layer disposed between the first and second vertical electrodes to penetrate through the stacked structure, wherein the first vertical electrode, the isolation layer, and the second vertical electrode are spaced apart from one another; a second inter-layer dielectric layer disposed over the isolation layer and the stacked structure divided by the first and second vertical electrodes; first and second contacts disposed over the first and second vertical electrodes, respectively, to be coupled with the first and second vertical electrodes; and conductive lines disposed over the second inter-layer dielectric layer and the first and second contacts.

In an embodiment, a method for fabricating an electronic device includes: forming first conductive lines stretched in a first direction over a substrate; forming an anti-oxidation layer on both sides of each of the first conductive lines; forming an inter-layer dielectric layer to fill a space between the first conductive lines; forming a material layer containing oxygen over the substrate structure including the inter-layer dielectric layer; forming second conductive lines over the material layer containing oxygen to intersect with the first conductive lines; and having the material layer react with the oxygen inside the inter-layer dielectric layer.

The material layer may include a transition metal oxide. The anti-oxidation layer may include a nitride. The material layer may react with the oxygen of the inter-layer dielectric layer through a thermal treatment. The forming of the second conductive lines may include: forming a second conductive line layer over the material layer; forming a mask pattern stretched in a direction intersecting with the first conductive lines over the second conductive line layer; and etching the second conductive line layer and the material layer by using the mask pattern as an etch barrier.

In an embodiment, a method for fabricating an electronic device includes: alternately stacking first inter-layer dielectric layers, first anti-oxidation layers, horizontal electrodes, and second anti-oxidation layers over a substrate; forming first openings that open the substrate by penetrating through the second anti-oxidation layers, the horizontal electrodes, the first anti-oxidation layers, and the first inter-layer dielectric layers that are stacked alternately; forming a material layer containing oxygen on sidewalls of each of the first openings; forming vertical electrodes to fill the first openings; and having the first inter-layer dielectric layers react with the material layer.

The method may further include: forming an isolation layer for isolating cells from each other by penetrating through the second anti-oxidation layers, the horizontal electrodes, the first anti-oxidation layers, and the first inter-layer dielectric layers between the vertical electrodes. The material layer may include a transition metal oxide. The first anti-oxidation layers and the second anti-oxidation layers may include a nitride. The material layer may react with the first inter-layer dielectric layers through a thermal treatment.

The method may further include: forming a second inter-layer dielectric layer over the substrate structure including the isolation layer, after the forming of the isolation layer; forming contacts that are coupled with the vertical electrodes by penetrating through the second inter-layer dielectric layer; and forming lines to be coupled with the contacts over the second inter-layer dielectric layer.

In an embodiment, an electronic device comprising a semiconductor memory circuit, wherein the semiconductor memory circuit may include a plurality of first conductive lines disposed over a substrate and spaced apart from each other; an anti-oxidation layer disposed on both sidewalls of each of the first conductive lines; an inter-layer dielectric layer disposed in a space between two adjacent first conductive lines including sidewalls on which the anti-oxide layer is disposed; a material layer formed over the first conductive lines and the inter-layer dielectric layer, the material layer including a first portion and a second portion; and a plurality of second conductive lines disposed over the material layer to intersect with the first conductive lines, wherein the first portion of the material layer is disposed in a first region where the first conductive line and the second conductive line overlap each other and the second portion of the material layer is disposed in a second region where the inter-layer dielectric layer and the second conductive line overlap each other, and wherein the first portion of the material layer has less oxygen contents than the second portion of the material layer.

The stacked structure may be a first stacked structure and the anti-oxidation layer may be a first anti-oxidation layer, the electronic device further comprising a second stacked structure stacked over the first stacked structure, wherein the second stacked structure includes: a second anti-oxidation layer disposed over the horizontal electrode of the first stacked structure; and a second inter-layer dielectric layer disposed over the second anti-oxidation layer.

The vertical electrode may be a first vertical electrode, the electronic device may further include a second vertical electrode coupled with the substrate by penetrating through the stacked structure, the second vertical electrode being spaced apart from the first vertical electrode; an isolation layer disposed between the first and second vertical electrodes to penetrate through the stacked structure, wherein the first vertical electrode, the isolation layer, and the second vertical electrode are spaced apart from one another; a second inter-layer dielectric layer disposed over the isolation layer and the stacked structure divided by the first and second vertical electrodes; first and second contacts disposed over the first and second vertical electrodes, respectively, to be coupled with the first and second vertical electrodes; and conductive lines disposed over the second inter-layer dielectric layer and the first and second contacts.

A method for fabricating an electronic device, the method may include forming a plurality of first conductive lines extending in a first direction over a substrate; forming an anti-oxidation layer on both sidewalls of each of the first conductive lines; forming an inter-layer dielectric layer to fill a space between two adjacent first conductive lines including sidewalls on which the anti-oxide layer is disposed; forming a material layer including oxygen vacancies over the first conductive lines and the inter-layer dielectric layer; forming a plurality of second conductive lines extending in a second direction over the material layer to intersect with the first conductive lines; and causing at least some of the oxygen vacancies of the material layer to react with oxygen ions migrated from the inter-layer dielectric layer.

A method for fabricating an electronic device, the method may include forming a stacked structure over a substrate, the stacked structure including a first inter-layer dielectric layer, a first anti-oxidation layer, a horizontal electrode, and a second anti-oxidation layer, which are vertically stacked; forming a plurality of first openings that expose the substrate by penetrating through the stacked structure; forming a material layer including oxygen vacancies on sidewalls of the first openings; forming a plurality of vertical electrodes to fill the first openings; and causing at least some of the oxygen vacancies in the material layer to react with oxygen ions migrated from the first inter-layer dielectric layer.

DETAILED DESCRIPTION

Figure 1:
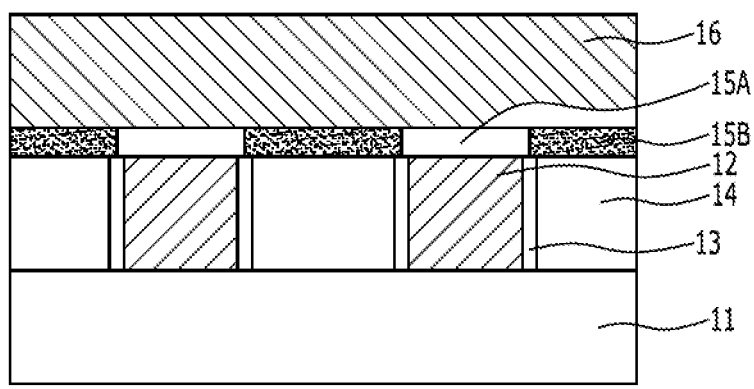
FIG. 1 is a cross-sectional view illustrating a semiconductor device in accordance with a first embodiment of the present disclosure.

Various embodiments of the present disclosure will be described with reference to the accompanying drawings. The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence of arranging the layers as shown reflects a particular implementation of an embodiment and a different relative positioning relationship or sequence of arranging the layers may be possible. In addition, an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a semiconductor device in accordance with a first embodiment of the present disclosure.

Referring to FIG. 1, the semiconductor device includes a substrate 11, first conductive lines 12 extending in a first direction over the substrate 11, an anti-oxidation layer 13 formed on both sidewalls of each conductive line 12, an inter-layer dielectric layer 14 filling the space between two adjacent first conductive lines 12.

The first conductive lines 12 may include a metal having a lower reaction rate with oxygen than that of a transition metal oxide. For example, the first conductive lines 12 may include platinum (Pt) or gold (Au). The anti-oxidation layer 13 may include a nitride. The inter-layer dielectric layer 14 may include an oxide.

The semiconductor device further includes second conductive lines 16 and oxygen-containing material layers 15A and 15B. The oxygen-containing material layers 15A and 15B are disposed in a first region and a second region, respectively, over a resultant structure including the first conductive lines 12 and the inter-layer dielectric layer 14. The second conductive lines 16 are disposed over the oxygen-containing material layers 15A and 15B and extend in a second direction. In an embodiment, the second direction is perpendicular to the first direction along which the first conductive lines 12 extend. The oxygen-containing material layers 15A and 15B are formed between a layer including the first conductive lines 12 and the inter-layer dielectric layer 14 and a layer including the second conductive lines 16.

In particular, the first material layer (or a first portion of the material layer) 15A, which is disposed in the first region where the first conductive lines 12 and the second conductive lines 16 overlap each other, may function as a resistance variable element of the semiconductor device. The second material layer (or a first portion of the material layer) 15B, which is disposed in the second region where the inter-layer dielectric layer 14 and the second conductive lines 16 overlap each other, has oxygen contents higher than that of the first material layer 15A in the first region and may function as an insulator. Hereafter, the first material layer 15A in the first region is referred to as a resistance variable pattern.

According to the embodiment described above, since the first conductive lines 12 are formed of a metal having a lower reaction rate with oxygen than that of a transition metal oxide and the anti-oxidation layer 13 is formed on both sidewalls of each of the first conductive lines 12, the resistance variable pattern 15A and the second material layer 15B in the second region may be formed using a thermal treatment without additionally performing a mask forming process to separate each of the resistance variable pattern 15A. As a result, a process to form an additional mask pattern may be omitted, thereby securing a process margin and reducing process difficulty.

FIGS. 2A to 2E are cross-sectional views illustrating a method for fabricating the semiconductor device in accordance with the first embodiment shown in FIG. 1. FIGS. 3A to 3E are plan views illustrating a method for fabricating the semiconductor device in accordance with the first embodiment shown in FIG. 1.

Figure 2A:
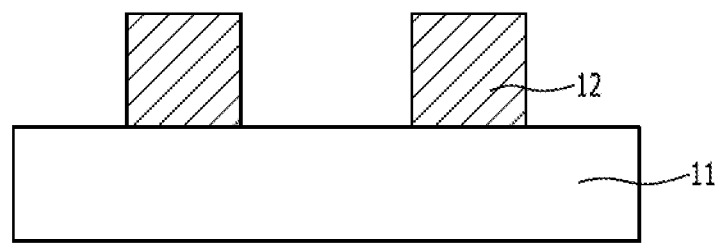
FIGS. 2A to 2E are cross-sectional views illustrating a method for fabricating the semiconductor device in accordance with the first embodiment of the present disclosure.
Figure 3A:
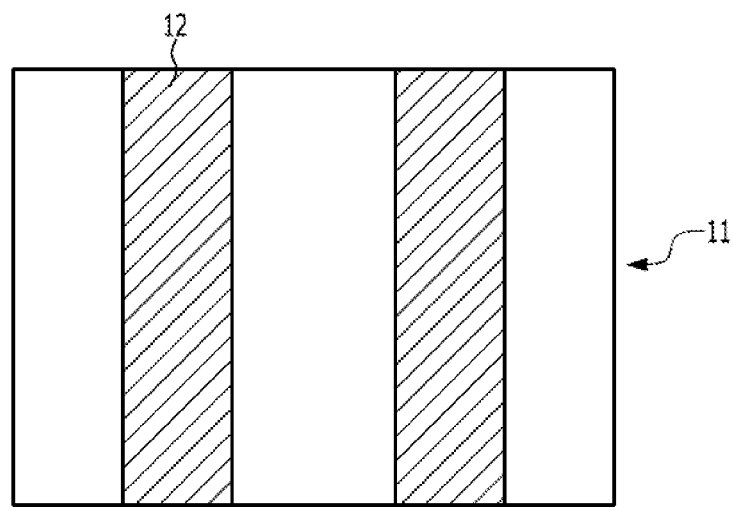
FIGS. 3A to 3E are plan views illustrating a method for fabricating the semiconductor device in accordance with the first embodiment of the present disclosure.

Referring to FIGS. 2A and 3A, first conductive lines 12 are formed over a substrate 11. The first conductive lines 12 are formed in a line type extending in a first direction (e.g., a vertical direction in FIG. 3A). The first conductive lines 12 may be used as electrodes for applying a voltage to a resistance variable pattern 15A (see FIG. 1). For example, the first conductive lines 12 may include platinum (Pt) or gold (Au). The first conductive lines 12 may be formed in parallel to each other over the substrate 11 along a second direction crossing the first direction.

The first conductive lines 12 may be formed by forming a conductive layer over the substrate 11, forming a mask pattern extending in the first direction over the conductive layer, and etching the conductive layer using the mask pattern as an etch barrier.

Figure 2B:
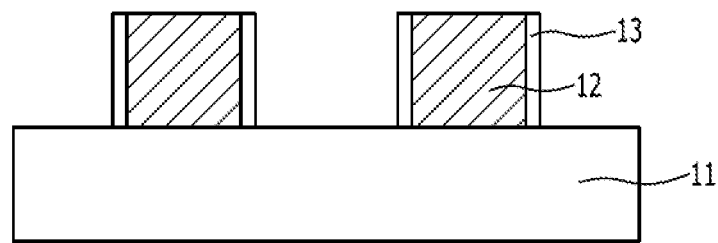
Figure 2E:
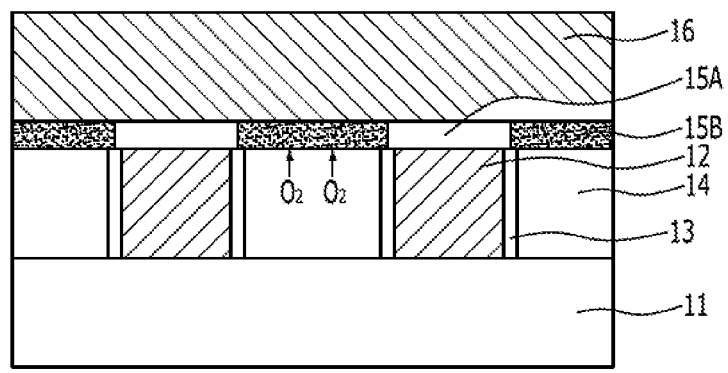
Figure 3B:
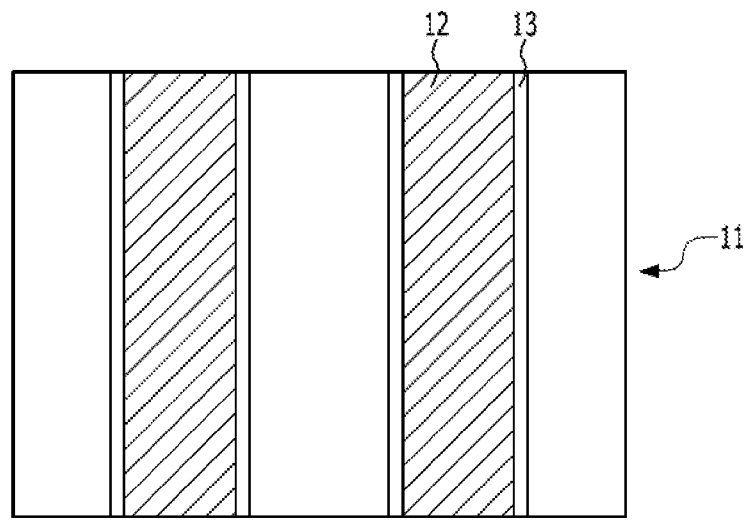

Referring to FIGS. 2B and 3B, an anti-oxidation layer 13 is formed on sidewalls of each of the first conductive lines 12. When the second material layer 15B in the second region reacts with the inter-layer dielectric layer 14, as shown in FIGS. 2E and 3E, the anti-oxidation layer 13 may block migration of oxygen ions from the inter-layer dielectric layer 14 to the first conductive lines 12 so that the first conductive lines 12 is substantially prevented from being oxidized. The anti-oxidation layer 13 may include an insulation material. In an embodiment, the anti-oxidation layer 13 includes a nitride.

The anti-oxidation layer 13 may be formed by depositing a nitride layer along a surface of a resultant structure of FIGS. 2A and 3A including the first conductive lines 12. Then, the deposited nitride layer may be etched in such a manner that the anti-oxidation layer 13 remains on both sidewalls of each of the first conductive lines 12. The deposited nitride layer may be etched using a highly anisotropic etching method (e.g., plasma etching, reactive ion etching, high-density plasma etching, or the like) to form the anti-oxidation layer 13.

Figure 2C:
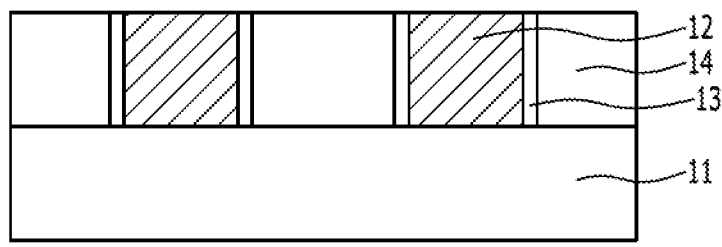
Figure 2D:
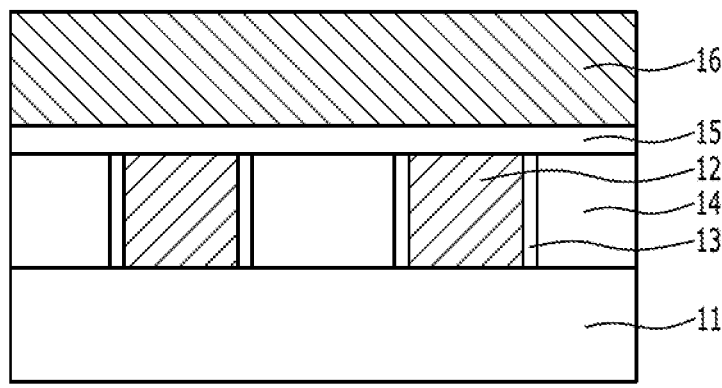
Figure 3C:
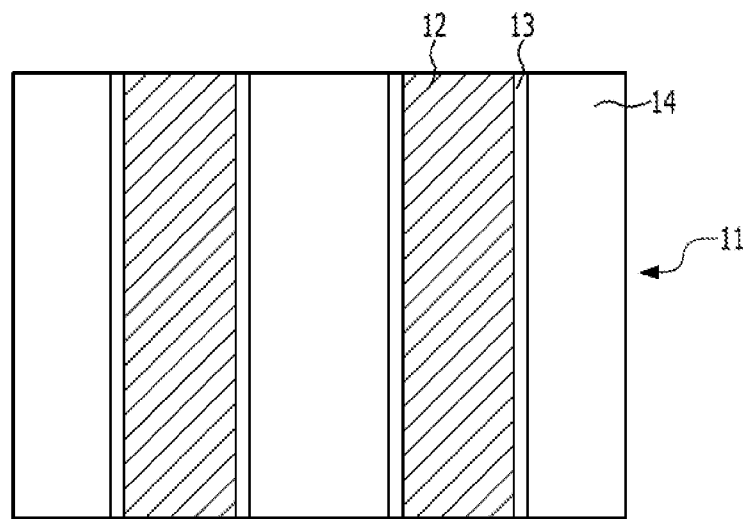

Referring to FIGS. 2C and 3C, an inter-layer dielectric layer 14 is formed to fill the space between the first conductive lines 12. The inter-layer dielectric layer 14 may perform as an insulator to electrically isolate the first conductive lines 12 from each other by filling the space between the first conductive lines 12. The inter-layer dielectric layer 14 may also perform as an oxygen supplying layer supplying oxygen ions to a material layer to be formed over the inter-layer dielectric layer 14. In an embodiment, the inter-layer dielectric layer 14 supplies oxygen ions to a material layer 15 shown in FIG. 2D. The inter-layer dielectric layer 14 may include an oxide.

The inter-layer dielectric layer 14 may be formed by forming an oxide layer over a resultant structure of FIGS. 2B and 3B and etching the oxide layer until top surfaces of the first conductive lines 12 are exposed. The oxide layer may be etched using a planarization process, such as a Chemical Mechanical Polishing (CMP) process.

Figure 3D:
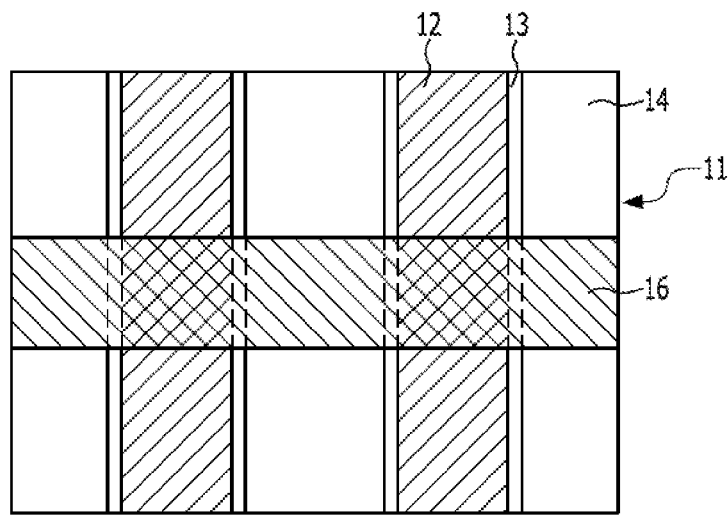
Figure 3E:
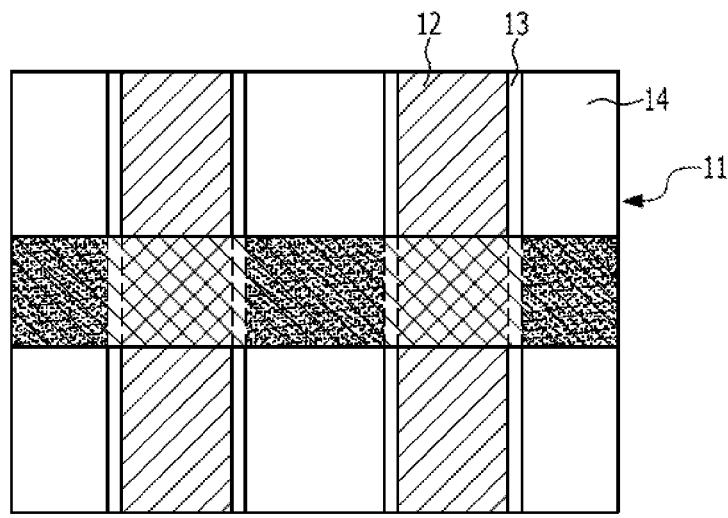

Referring to FIGS. 2D and 3D, a material layer 15 is formed over a resultant structure of FIGS. 2C and 3C including the inter-layer dielectric layer 14 and the first conductive lines 12. The material layer 15 may be formed of a material that has a resistance state changing depending on a voltage or a current applied thereto. In an embodiment, the material layer 15 includes a transition metal oxide. The transition metal oxide may include a binary oxide, a ternary oxide, and an oxide having more than three elements. The binary oxide may include a titanium (Ti) oxide, a tantalum (Ta) oxide, an iron (Fe) oxide, a tungsten (W) oxide, a hafnium (Hf) oxide, a niobium (Nb) oxide, a zirconium (Zr) oxide, a nickel (Ni) oxide, or the like. The oxide having more than three elements may include PCMO (PrCaMnO) or the like.

The material layer 15 may include an oxide that is deficient in oxygen compared to a corresponding oxide that satisfies a stoichiometric ratio, so that the material layer 15 can have oxygen vacancies. For example, when a voltage higher than a predetermined value is applied to the material layer 15, according to the movement of the oxygen vacancies, a plurality of filaments acting as current paths is formed in the material layer 15. As a result, the material layer 15 is set to a low resistance state. Conversely, when the plurality of filaments disappears in the material layer 15, the material layer 15 is reset to a high resistance state.

Subsequently, second conductive lines 16 are formed over the material layer 15. The second conductive lines 16 may be formed in a line type extending in a second direction (e.g., a horizontal direction of FIG. 2D), which is substantially perpendicular to the first direction along which the first conductive lines 12 extend. The second conductive lines 16 may be used as electrodes for applying a voltage across the material layer 15 along with the first conductive lines 12. The second conductive lines 16 may include a metal or a metal nitride, or both. In an embodiment, the second conductive lines 16 may include a metal, such as platinum (Pt), tungsten (W), aluminum (Al), copper (Cu), tantalum (Ta), or the like. The second conductive lines 16 may include a metal nitride, such as a titanium nitride (TiN), a tantalum nitride (TaN), or the like.

The second conductive lines 16 may be formed by forming a conductive layer over the material layer 15, forming a mask pattern extending in the second direction over the conductive layer, and etching the conductive layer using the mask pattern as an etch barrier. The material layer 15 may be also patterned in a line type extending in the second direction during the process of etching the second conductive lines 16.

As a result, some portions of the patterned material layer 15 are disposed in a first region where the first conductive lines 12 and the second conductive lines 16 overlap each other. Each of these portions of the pattern material layer 15 is used to form a memory cell. However, since other portions of the patterned material layer 15 are disposed in a second region where the first conductive lines 12 and the second conductive lines 16 do not overlap each other, disturbance may occur during an operation of a memory cell. Therefore, it is desirable to convert the characteristics of the portions of the patterned material layer 15 disposed in the second region where the first conductive lines 12 and the second conductive lines 16 do not overlap each other, thereby electrically isolating adjacent memory cells to address the disturbance issue.

Referring to FIGS. 2E and 3E, a thermal treatment is performed on a resultant structure of FIGS. 2D and 3D so that the oxygen ions in the inter-layer dielectric layer 14 react with oxygen vacancies in the portions of the patterned material layer 15 disposed in the second region where the inter-layer dielectric layer 14 and the second conductive lines 16 overlap each other.

As a result, the patterned material layer 15 is divided into the first material layer 15A in the first region where the first conductive lines 12 and the second conductive lines 16 overlap each other and the second material layer 15B in the second region where the inter-layer dielectric layer 14 and the second conductive lines 16 overlap each other. Since the first material layer 15A is not in contact with the inter-layer dielectric layer 14, oxygen vacancies in the first material layer 15A do not substantially react with oxygen ions migrated from the inter-layer dielectric layer 14 during the thermal treatment. As a result, the first material layer 15A may maintain its characteristics as a resistance variable element, which results from the material layer 15 of FIGS. 2D and 3D including an oxide that is deficient in oxygen compared to a corresponding oxide that satisfies a stoichiometric ratio. Hereafter, the first material layer 15A is referred to as a resistance variable pattern.

Since the second material layer 15B is in contact with the inter-layer dielectric layer 14, oxygen vacancies in the second material layer 15B may react with the oxygen ions migrated from the inter-layer dielectric layer 14 during the thermal treatment. As a result, the number of oxygen vacancies in the second material layer 15B may be sufficiently decreased, so that the second material layer 15B loses the characteristics of the material layer 15 as a resistance variable element and becomes a high-resistance material. As a result, the material layer 15B becomes an insulation layer and electrically isolates a memory cell including the resistance variable pattern 15A from another memory cell adjacent to the memory cell. While the resistance variable pattern 15A includes an oxide that is deficient in oxygen compared to a corresponding oxide that satisfies a stoichiometric ratio, the material layer 15B includes an oxide that satisfies the stoichiometric ratio.

According to embodiments described above, the resistance variable pattern 15A may be formed in regions where the first conductive lines 12 and the second conductive lines 16 overlap each other using a thermal treatment. As a result, a process to form an additional mask pattern may be omitted, thereby securing a process margin as well as reducing process difficulty. Since the first conductive lines 12 include a metal having a lower reaction rate with oxygen than that of a transition metal oxide and the anti-oxidation layer 13 is formed on both sidewalls of each first conductive line 12, oxidation of the first conductive lines 12 may be substantially prevented in the thermal treatment.

Figure 4:
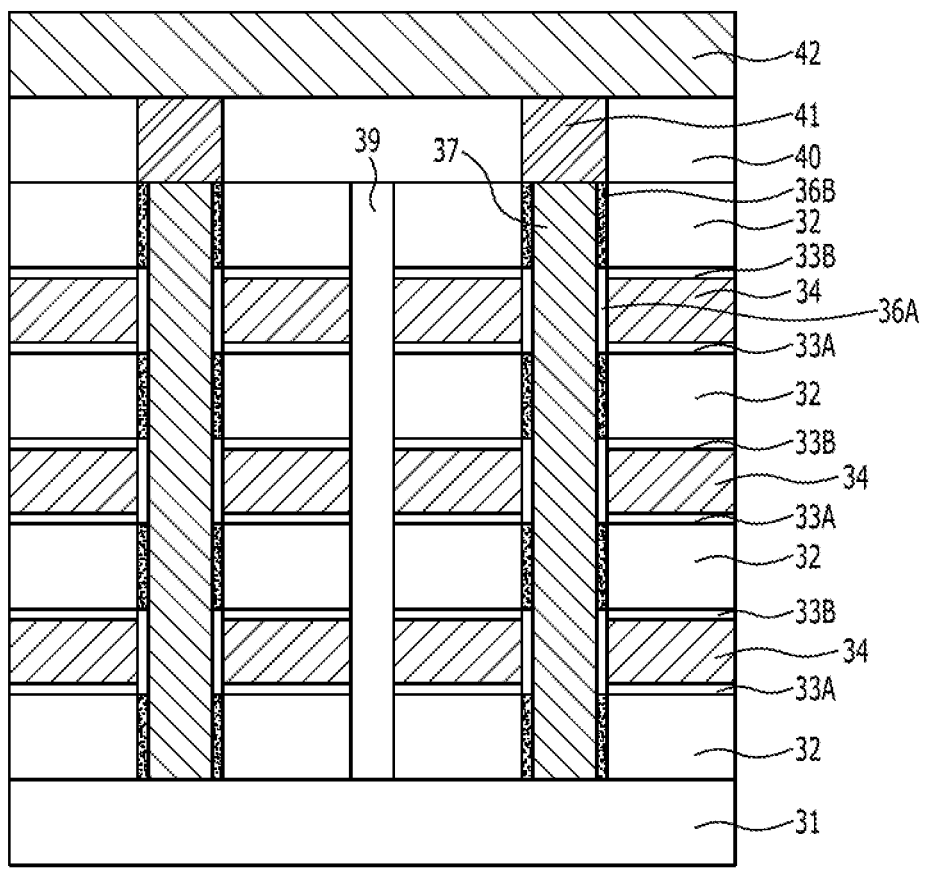
FIG. 4 is a cross-sectional view illustrating a semiconductor device in accordance with a second embodiment of the present disclosure.

FIG. 4 is a cross-sectional view illustrating a semiconductor device in accordance with a second embodiment of the present disclosure.

Referring to FIG. 4, the semiconductor device includes a substrate 31 and a plurality of structures each having a first inter-layer dielectric layer 32, a first anti-oxidation layer 33A, horizontal electrodes 34, and a second anti-oxidation layer 33B. The plurality of structures is vertically stacked over the substrate 31.

The horizontal electrodes 34 may include a metal having a lower reaction rate with oxygen than that of a transition metal oxide. For example, the horizontal electrodes 34 may include platinum (Pt) or gold (Au). The first anti-oxidation layers 33A and the second anti-oxidation layers 33B may include a nitride. The first inter-layer dielectric layers 32 may include an oxide.

The semiconductor device further includes a vertical electrode 37 and first and second oxygen-containing material layers 36A and 36B. The vertical electrode 37 is coupled with the substrate 31 and a contact 41 by penetrating through the first inter-layer dielectric layers 32, the first anti-oxidation layers 33A, the horizontal electrodes 34, and the second anti-oxidation layers 33B. The oxygen-containing material layers 36A and 36B are interposed between the vertical electrode 37 and the plurality of structures including the horizontal electrodes 34 and first inter-layer dielectric layers 32.

In particular, the first material layer 36A is disposed in a first region where the horizontal electrode 34 and the vertical electrode 37 overlap each other, and the first material layer 36A may function as a resistance variable element of the semiconductor device. The second material layer 36B is disposed in a second region where the first inter-layer dielectric layer 32 and the vertical electrode 37 overlap each other. The second material layer 36B has oxygen contents higher than that of the first material layer 36A, and thus functions as an insulator. Hereafter, the first material layer 36A is referred to as a resistance variable pattern.

The semiconductor device further includes an isolation layer 39, a second inter-layer dielectric layer 40, contacts 41, and lines 42 (or conductive lines 42). The isolation layer 39 electrically isolates cell structures from each other by penetrating through the first inter-layer dielectric layers 32, the first anti-oxidation layers 33A, the horizontal electrodes 34, and the second anti-oxidation layers 33B. Each of the cell structures has a vertically stacked structure in which the first inter-layer dielectric layer 32, the first anti-oxidation layer 33A, the horizontal electrode 34, and the second anti-oxidation layer 33B are repeatedly stacked. The second inter-layer dielectric layer 40 is formed over the cell structures. The contacts 41 penetrate through the second inter-layer dielectric layer 40 to be coupled with the corresponding vertical electrodes 37. The lines 42 are formed over the second inter-layer dielectric layers 40 and the contacts 41, and electrically coupled to the contacts 41.

According to embodiments described above, since the horizontal electrodes 34 are formed of a metal having a lower reaction rate with oxygen than that of a transition metal oxide and the first anti-oxidation layers 33A and the second anti-oxidation layers 33B are formed below and over the horizontal electrodes 34, respectively, the resistance variable pattern 36A and the second material layer 36B may be formed using a thermal treatment without additionally performing a mask forming process. As a result, a process to form an additional mask pattern may be omitted, thereby securing a process margin and reducing process difficulty.

FIGS. 5A to 5E are cross-sectional views illustrating a method for fabricating the semiconductor device in accordance with the second embodiment of the present disclosure shown in FIG. 4. In this embodiment, the semiconductor device has a three-dimensional structure in which a plurality of memory cells is stacked vertically over a substrate.

Figure 5A:
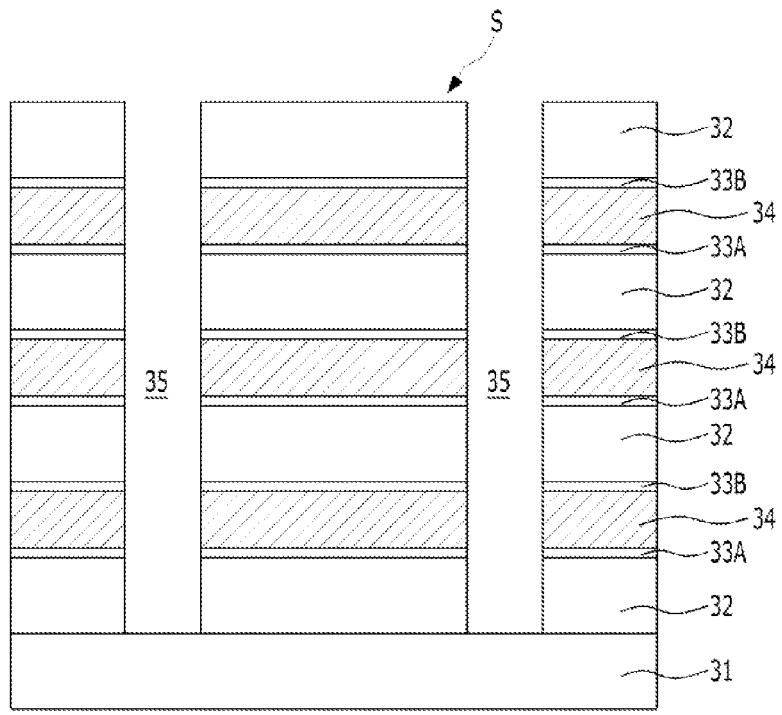
FIGS. 5A to 5E are cross-sectional views illustrating a method for fabricating the semiconductor device in accordance with the second embodiment of the present disclosure.

Referring to FIG. 5A, a first inter-layer dielectric layer 32, a first anti-oxidation layer 33A, a horizontal electrode 34, and a second anti-oxidation layer 33B are repeatedly stacked over a substrate 31 to form a stacked structure.

The first inter-layer dielectric layer 32 may function as an insulator to electrically insulate the horizontal electrodes 34 from each other. The first inter-layer dielectric layer 32 may also function as an oxygen supplying layer to convert a part of an oxygen-containing material layer 36 of FIG. 5B into a material layer 36B of FIG. 4, which acts as an insulation layer. The first inter-layer dielectric layer 32 may include an oxide.

The horizontal electrode 34 may be used as an electrode for applying a voltage to a resistance variable pattern 36A of FIG. 4. The horizontal electrode 34 may include a metal having a lower reaction rate with oxygen than that of a transition metal oxide. For example, the horizontal electrode 34 may include platinum (Pt) or gold (Au).

The first anti-oxidation layer 33A and the second anti-oxidation layer 33B are formed below and over the horizontal electrode 34, respectively. The first anti-oxidation layer 33A and the second anti-oxidation layer 33B may protect the horizontal electrode 34 from being oxidized when oxygen vacancies in some portions of the material layer 36 of FIG. 5B react with oxygen ions migrated from the first inter-layer dielectric layers 32. The first anti-oxidation layer 33A and the second anti-oxidation layer 33B may include an insulation material. For example, the first anti-oxidation layer 33A and the second anti-oxidation layer 33B may include a nitride.

The number of times the first inter-layer dielectric layer 32, the first anti-oxidation layer 33A, the horizontal electrode 34, and the second anti-oxidation layer 33B are stacked may be varied according to embodiments. A resultant structure of FIG. 5 includes the first inter-layer dielectric layer 32 as the uppermost layer.

Subsequently, first openings 35 are formed to divide the stacked structure into a plurality of portions S and to expose a top surface of the substrate 31 by etching the first inter-layer dielectric layers 32, the first anti-oxidation layers 33A, the horizontal electrodes 34, and the second anti-oxidation layers 33B, which are vertically stacked. The first openings 35 may be formed by forming a mask pattern that opens regions where the first openings 35 are to be formed and etching the first inter-layer dielectric layers 32, the first anti-oxidation layers 33A, the horizontal electrodes 34, and the second anti-oxidation layers 33B using the mask pattern as an etch barrier.

Figure 5B:
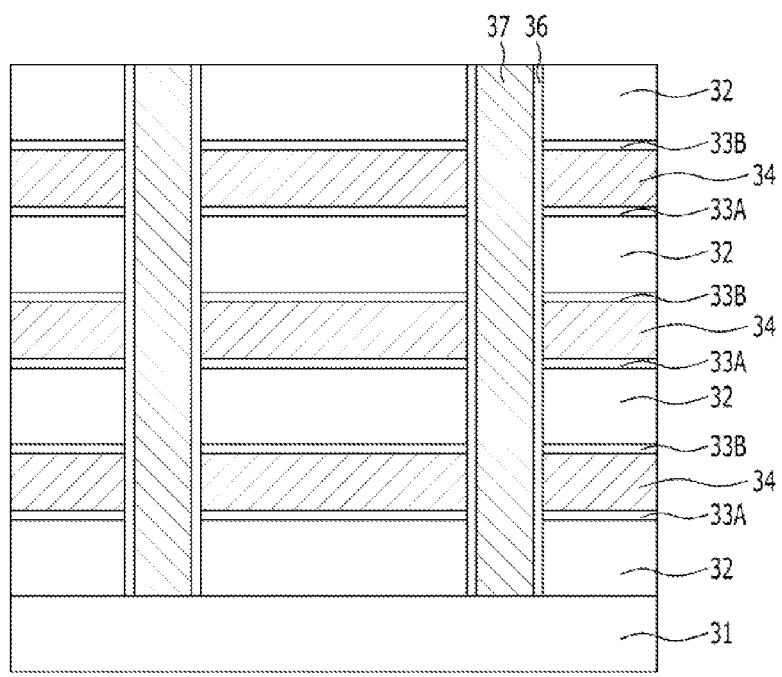

Referring to FIG. 5B, an oxygen-containing material layer 36 is formed on sidewalls of the first openings 35. The material layer 36 may include a material that has a resistance state changing depending on a voltage or a current applied thereto. In an embodiment, the material layer 36 includes a transition metal oxide. The transition metal oxide may include a binary oxide, a ternary oxide, and an oxide having more than three elements. The binary oxide may include a titanium (Ti) oxide, a tantalum (Ta) oxide, an iron (Fe) oxide, a tungsten (W) oxide, a hafnium (Hf) oxide, a niobium (Nb) oxide, a zirconium (Zr) oxide, a nickel (Ni) oxide, or the like. The oxide having more than three elements may include PCMO (PrCaMnO) or the like.

The material layer 36 may include an oxide that is deficient in oxygen compared to a corresponding oxide that satisfies a stoichiometric ratio, so that the material layer 36 can have oxygen vacancies. For example, when a voltage higher than a predetermined value is applied to the material layer 36, according to the movement of the oxygen vacancies, a plurality of filaments acting as current paths is formed in the material layer 36. As a result, the material layer 36 is set to a low resistance state. Conversely, when the plurality of filaments disappears in the material layer 36, the material layer 36 is reset to a high resistance state.

The material layer 36 may be formed by forming a transition metal oxide layer over a resultant structure of FIG. 5A including the first openings 35 and performing an etch process on the transition metal oxide layer in such a manner that the transition metal oxide layer remains on the sidewalls of the first openings 35.

Subsequently, vertical electrodes 37 are formed to fill the first openings 35 that remain after the formation of the material layer 36. The vertical electrodes 37 may be used as electrodes for applying a voltage across the material layer 36 along with the horizontal electrodes 34. The vertical electrodes 37 may include a metal or a metal nitride, or both. For example, the vertical electrodes 37 may include a metal, such as platinum (Pt), tungsten (W), aluminum (Al), copper (Cu), tantalum (Ta), or the like. The vertical electrodes 37 may include a metal nitride, such as a titanium nitride (TiN), a tantalum nitride (TaN), or the like.

The vertical electrodes 37 may be formed by forming a metal-containing layer to fill the first openings 35 and performing a planarization process until the uppermost layer of the stacked structure is exposed. The planarization process may be a Chemical Mechanical Polishing (CMP) process.

As a result, some portions of the material layer 36 are disposed in regions where the horizontal electrodes 34 and the vertical electrodes 37 overlap each other. Each of these portions of the material layer 36 is used to form a memory cell. However, since other portions of the material layer 36 are disposed in regions where the horizontal electrodes 34 and the vertical electrodes 37 do not overlap each other, disturbance may occur during an operation of a memory cell. Therefore, it is desirable to convert characteristics of the portions of the material layer 36 in the regions where the horizontal electrodes 34 and the vertical electrodes 37 do not overlap each other, thereby electrically isolating adjacent memory cells to address the disturbance issue.

Figure 5C:
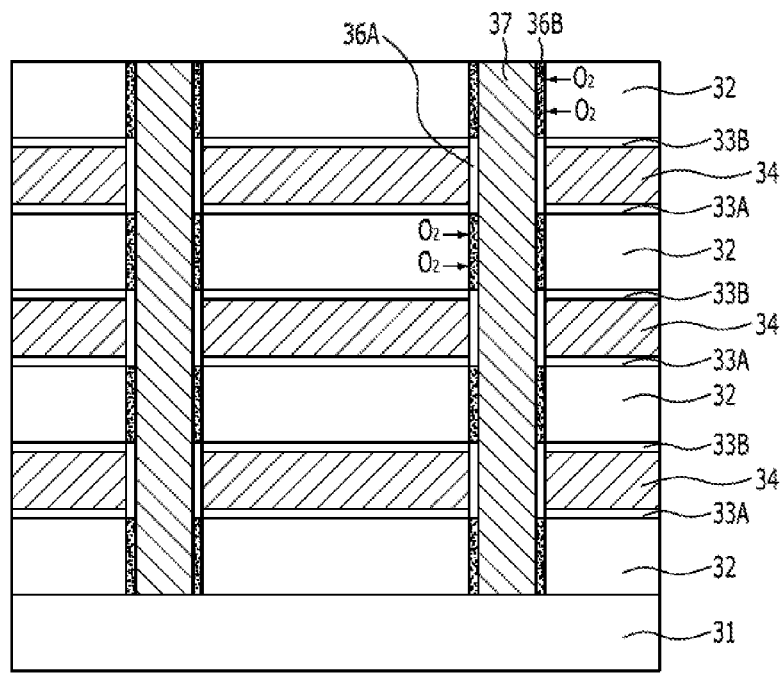

Referring to FIG. 5C, a thermal treatment is performed on a resultant structure of FIG. 5B so that a the oxygen ions in the first inter-layer dielectric layers 32 react with oxygen vacancies of the portions of the material layer 36 disposed in the regions where the first inter-layer dielectric layers 32 and the vertical electrodes 37 overlap each other.

As a result, the material layer 36 of FIG. 5B is divided into a first material layer 36A disposed in a first region where the horizontal electrode 34 and the vertical electrode 37 overlap each other and a second material layer 36B disposed in a second region where the first inter-layer dielectric layer 32 and the vertical electrode 37 do not overlap each other. Since the first material layer 36A is not in contact with the first inter-layer dielectric layer 32, oxygen vacancies in the first material layer 36A do not substantially react with oxygen ions migrated from the first inter-layer dielectric layer 32 during the thermal treatment. As a result, the first material layer 36A may maintain the characteristics of the material layer 36 as a resistance variable element, which results from the material layer 36 of FIG. 5B including an oxide that is deficient in oxygen compared to a corresponding oxide that satisfies a stoichiometric ratio. Hereafter, the first material layer 36A is referred to as a resistance variable pattern.

Since the second material layer 36B is in contact with the first inter-layer dielectric layer 32, oxygen vacancies in the second material layer 36B may react with the oxygen ions migrated from the first inter-layer dielectric layers 32 during the thermal treatment. As a result, the number of the oxygen vacancies in the second material layer 36B may be sufficiently decreased, so that the second material layer 36B loses the characteristics of the material layer 36 as a resistance variable element and becomes a high-resistance material. As a result, the second material layer 36B becomes an insulation layer to electrically isolate adjacent a memory cell including the resistance variable pattern 36A from another memory cell adjacent to the memory cell. While the resistance variable pattern 36A includes an oxide that is deficient in oxygen compared to a corresponding oxide that satisfies a stoichiometric ratio, the material layer 36B includes an oxide that satisfies the stoichiometric ratio.

Figure 5D:
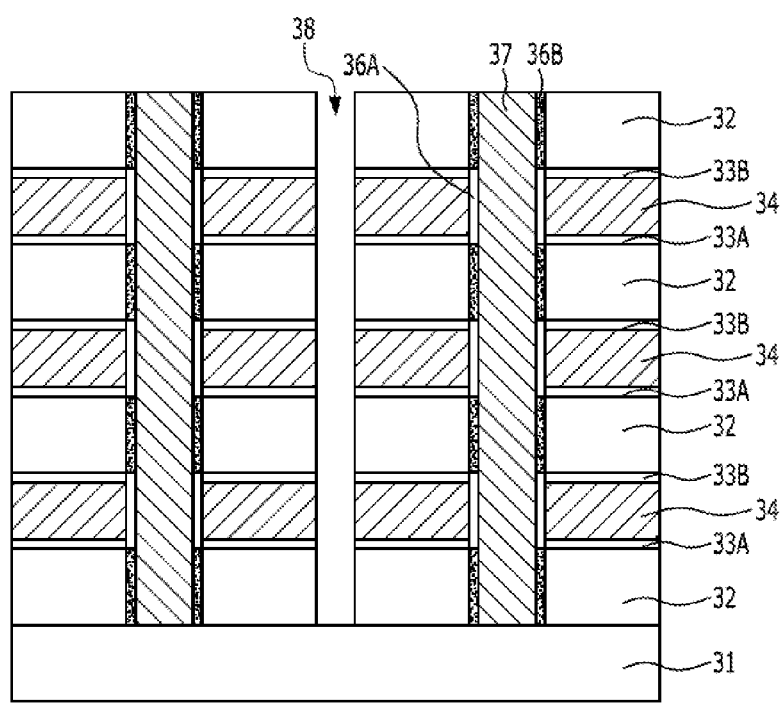

Referring to FIG. 5D, second openings 38 are formed between the vertical electrodes 37 to divide each stacked structure S (see FIG. 5A) into two portions. The second opening 38 may be formed by forming a mask pattern over the stacked structure S that opens a region where the second opening 38 is to be formed, and etching the first inter-layer dielectric layers 32, the first anti-oxidation layers 33A, the horizontal electrodes 34, and the second anti-oxidation layers 33B of the stacked structure S using the mask pattern as an etch barrier.

Figure 5E:
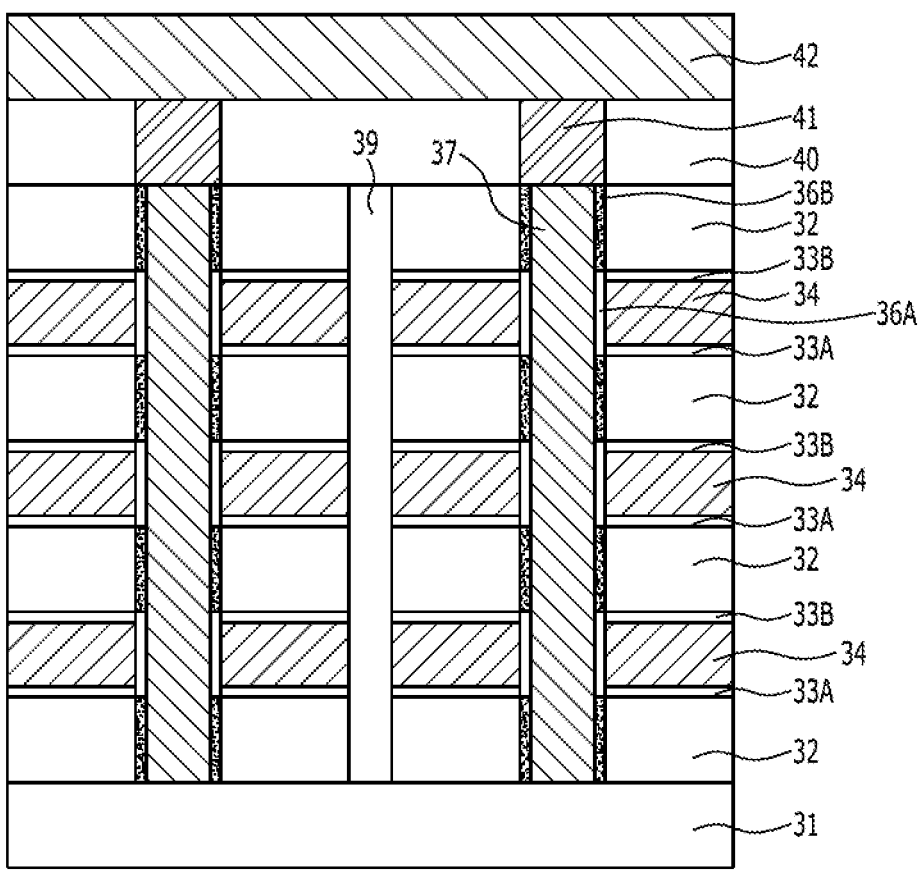

Referring to FIG. 5E, an isolation layer 39 is formed to electrically isolate memory cells by filling the second openings 38 with an insulation material.

Subsequently, a second inter-layer dielectric layer 40 is formed over a resultant structure including the isolation layer 39. The second inter-layer dielectric layer 40 insulates an upper line layer, e.g., lines 42, from the memory cells formed under the second inter-layer dielectric layer 40. The second inter-layer dielectric layer 40 may include an insulation material. For example, the second inter-layer dielectric layer 40 may include an oxide.

Subsequently, contacts 41 are formed to fill spaces between the second inter-layer dielectric layers 40. The contacts 41 electrically couple the vertical electrodes 37 to the lines 42, which are formed over the second inter-layer dielectric layer 40 and the contacts 41. The contacts 41 and the lines 42 may be used to apply a voltage to the vertical electrodes 37. The contacts 41 and the lines 42 may be formed of a conductive material.

According to embodiments described above, the resistance variable pattern 36A may be formed in a region where the horizontal electrode 34 and the vertical electrode 37 overlap each other using a thermal treatment. As a result, a process to form an additional mask pattern may be omitted, thereby securing a process margin as well as reducing process difficulty. Since the horizontal electrode 34 includes a metal having a lower reaction rate with oxygen than that of a transition metal oxide and the first anti-oxidation layer 33A and the second anti-oxidation layer 33B are formed under and over each horizontal electrode 34, respectively, oxidation of the horizontal electrode 34 may be substantially prevented in the thermal treatment.

The above and other memory circuits or semiconductor devices based on the disclosed technology may be used in a range of devices or systems. FIGS. 6-10 provide some examples of devices or systems that may implement the memory circuits disclosed herein.

Figure 6:
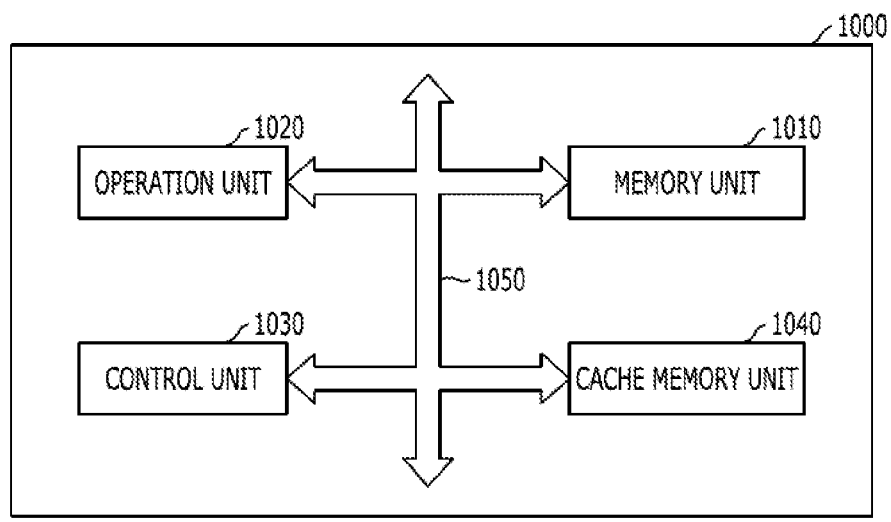
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include a plurality of first conductive lines including an anti-oxidation layer on both sides of each first conductive line, an inter-layer dielectric layer suitable for gap-filling a space between the first conductive lines, a material layer formed over the first conductive lines and the inter-layer dielectric layer and containing oxygen, and a plurality of second conductive lines formed over the material layer to intersect with the first conductive lines. Herein, the material layer of a first region where the first conductive lines and the second conductive lines overlap each other has a higher oxygen content than the material layer of a second region where the inter-layer dielectric layer and the second conductive lines overlap each other. An integration of the memory unit 1010 is increased, and a fabrication process thereof is simplified. In this way, the size of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
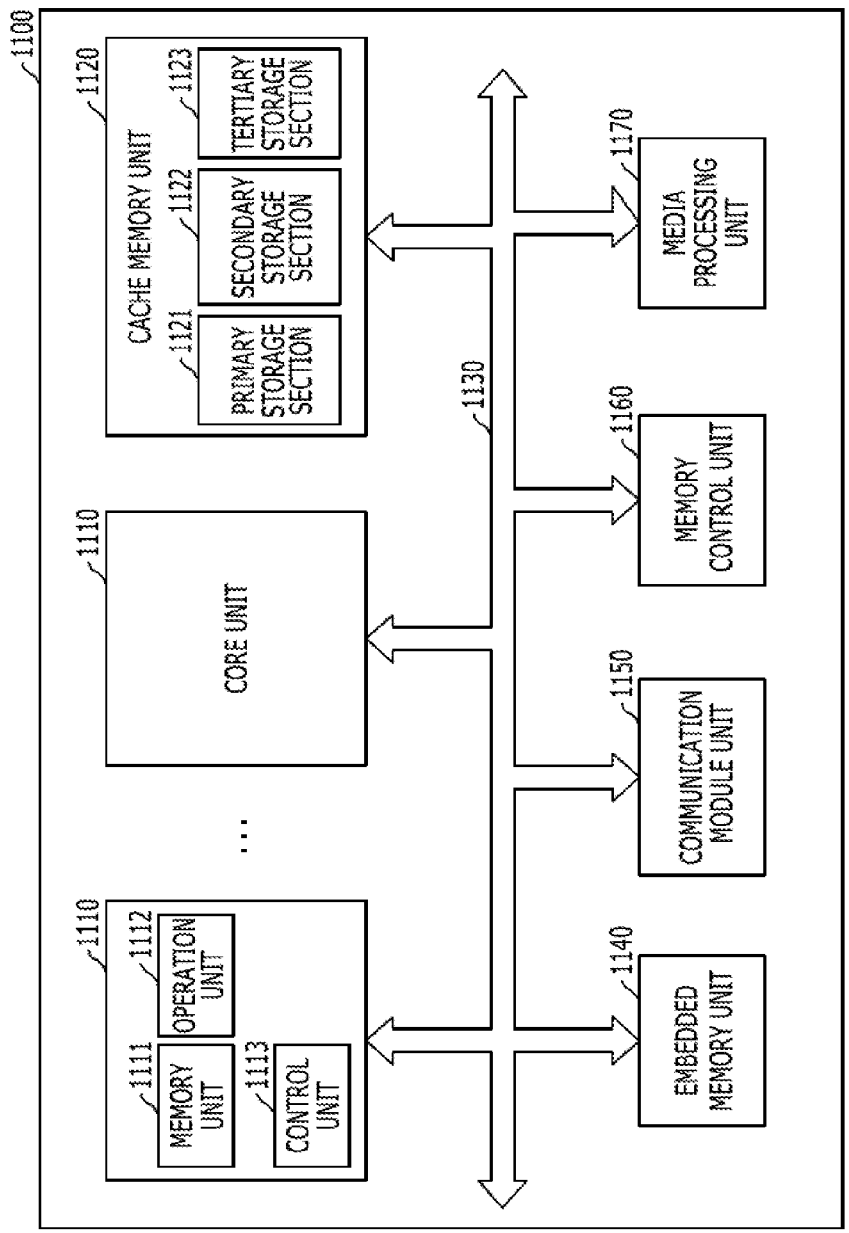
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest.

At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a plurality of first conductive lines including an anti-oxidation layer on both sides of each first conductive line, an inter-layer dielectric layer suitable for gap-filling a space between the first conductive lines, a material layer formed over the first conductive lines and the inter-layer dielectric layer and containing oxygen, and a plurality of second conductive lines formed over the material layer to intersect with the first conductive lines. Herein, the material layer of a first region where the first conductive lines and the second conductive lines overlap each other has a higher oxygen content than the material layer of a second region where the inter-layer dielectric layer and the second conductive lines overlap each other. The integration of the cache memory unit 1120 is increased, and a fabrication process thereof is simplified. In this way, the size of the processor 1100 may be reduced.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
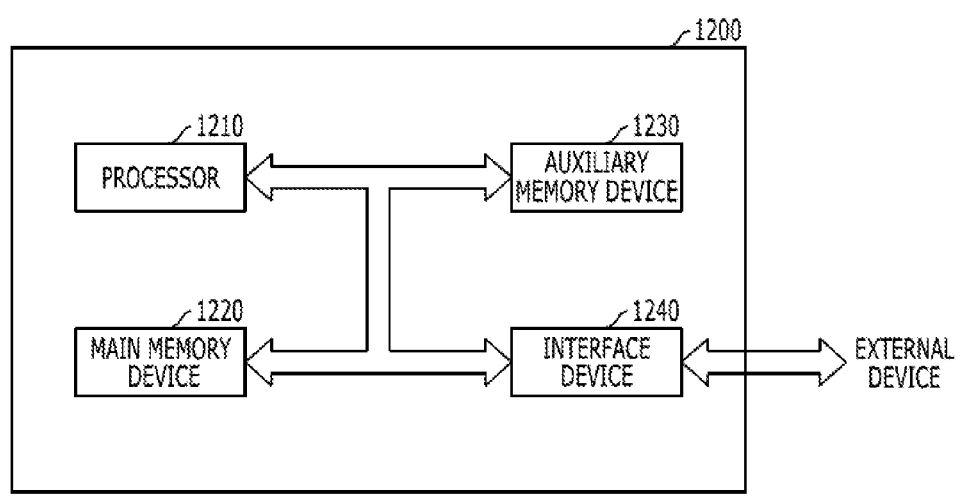
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. For example, the main memory device 1220 may include a plurality of first conductive lines including an anti-oxidation layer on both sides of each first conductive line, an inter-layer dielectric layer suitable for gap-filling a space between the first conductive lines, a material layer formed over the first conductive lines and the inter-layer dielectric layer and containing oxygen, and a plurality of second conductive lines formed over the material layer to intersect with the first conductive lines. Herein, the material layer of a first region where the first conductive lines and the second conductive lines overlap each other has a higher oxygen content than the material layer of a second region where the inter-layer dielectric layer and the second conductive lines overlap each other. The integration of main memory device 1220 is increased, and a fabrication process thereof is simplified. In this way, the size of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the embodiments. For example, the auxiliary memory device 1230 may include a plurality of first conductive lines including an anti-oxidation layer on both sides of each first conductive line, an inter-layer dielectric layer suitable for gap-filling a space between the first conductive lines, a material layer formed over the first conductive lines and the inter-layer dielectric layer and containing oxygen, and a plurality of second conductive lines formed over the material layer to intersect with the first conductive lines. Herein, the material layer of a first region where the first conductive lines and the second conductive lines overlap each other has a higher oxygen content than the material layer of a second region where the inter-layer dielectric layer and the second conductive lines overlap each other. The integration of auxiliary memory device 1230 is increased, and a fabrication process thereof is simplified. In this way, the size of the system 1200 may be reduced.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
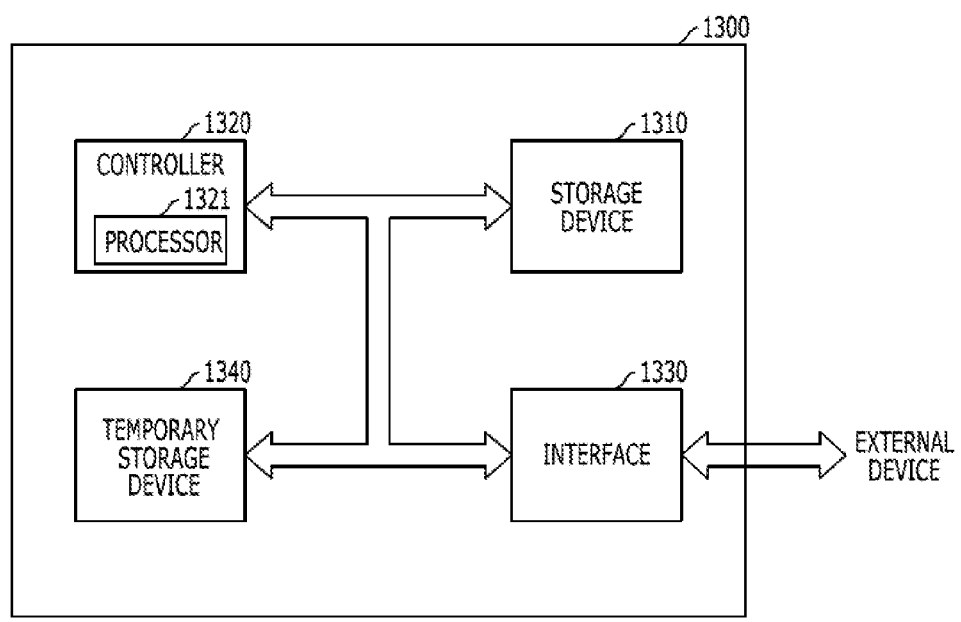
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. For example, the temporary storage device 1340 may include a plurality of first conductive lines including an anti-oxidation layer on both sides of each first conductive line, an inter-layer dielectric layer suitable for gap-filling a space between the first conductive lines, a material layer formed over the first conductive lines and the inter-layer dielectric layer and containing oxygen, and a plurality of second conductive lines formed over the material layer to intersect with the first conductive lines. Herein, the material layer of a first region where the first conductive lines and the second conductive lines overlap each other has a higher oxygen content than the material layer of a second region where the inter-layer dielectric layer and the second conductive lines overlap each other. The integration of temporary storage device 1340 is increased, and a fabrication process thereof is simplified. In this way, the size of the data storage system 1300 may be reduced.

Figure 10:
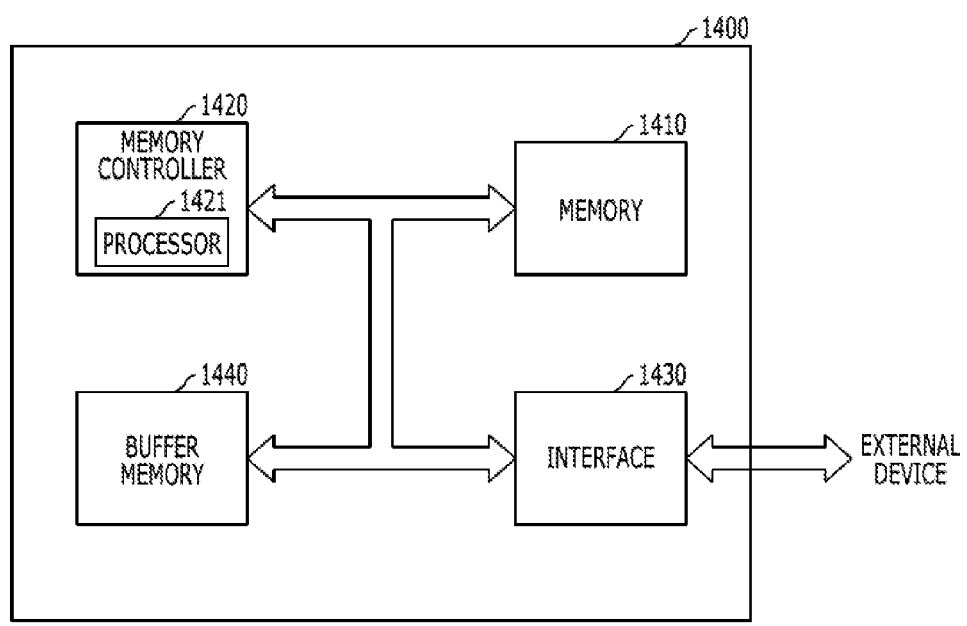
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include a plurality of first conductive lines including an anti-oxidation layer on both sides of each first conductive line, an inter-layer dielectric layer suitable for gap-filling a space between the first conductive lines, a material layer formed over the first conductive lines and the inter-layer dielectric layer and containing oxygen, and a plurality of second conductive lines formed over the material layer to intersect with the first conductive lines. Herein, the material layer of a first region where the first conductive lines and the second conductive lines overlap each other has a higher oxygen content than the material layer of a second region where the inter-layer dielectric layer and the second conductive lines overlap each other. The integration of memory 1410 is increased, and a fabrication process thereof is simplified. In this way, the size of the memory system 1400 may be reduced.

Also, the memory 1410 according to the this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

Moreover, the buffer memory 1440 according to the this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the embodiments, patterning of a resistance variable element is easy, and it is possible to secure the characteristics of the resistance variable element.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

According to the electronic device and the method for fabricating the same, which are described in the above embodiments of the present disclosure, integration degree may be increased and the fabrication process may simplified, while reducing production cost.

While this present disclosure contains many specifics, these should not be construed as limitations on the scope of any invention or of what may be claimed, but rather as descriptions of features that may be specific to particular embodiments of particular inventions. Certain features that are described in this disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this disclosure should not be understood as requiring such separation in all embodiments. Only a few implementations and examples are described. Other implementations, enhancements and variations can be made based on what is described and illustrated in this disclosure.

What is claimed is:

1. A method for fabricating an electronic device, the method comprising:
   forming a stacked structure over a substrate, the stacked structure including a first inter-layer dielectric layer, a first anti-oxidation layer, a horizontal electrode, and a second anti-oxidation layer, which are vertically stacked;
   forming a plurality of first openings that expose the substrate by penetrating through the stacked structure;
   forming a material layer including oxygen vacancies on sidewalls of the first openings;
   forming a plurality of vertical electrodes to fill the first openings; and
   causing a portion in the material layer to react with oxygen ions migrated from the first inter-layer dielectric layer.

2. The method according to claim 1, wherein the material layer includes a transition metal oxide.

3. The method according to claim 1, wherein the portion in the material layer includes at least some of the oxygen vacancies.

4. The method according to claim 3, wherein the first anti-oxidation layer and the second anti-oxidation layer include a nitride.

5. The method according to claim 4, wherein the causing comprises performing a thermal treatment on a structure resulting from the forming of the plurality of vertical electrodes.

6. The method according to claim 1, further comprising:
   forming an isolation layer to penetrate through the stacked structure between two adjacent vertical electrodes, wherein the two adjacent vertical electrodes and the isolation layer are spaced apart from one another.

7. The method according to claim 6, further comprising:
   forming a second inter-layer dielectric layer over the isolation layer and the stacked structure divided by the plurality of vertical electrodes;
   forming a plurality of contacts over the plurality of vertical electrodes to be coupled with the vertical electrodes; and
   forming a plurality of conductive lines over the second inter-layer dielectric layer and the contacts.

* * * * *